United States Patent
Iwai et al.

(10) Patent No.: US 8,760,924 B2
(45) Date of Patent: Jun. 24, 2014

(54) NONVOLATILE SEMICONDUCTOR MEMORY DEVICE AND METHOD OF DATA WRITE THEREIN

(75) Inventors: Hitoshi Iwai, Kamakura (JP); Tomoko Fujiwara, Odawara (JP); Hideaki Aochi, Kawasaki (JP); Masaru Kito, Kuwana (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 251 days.

(21) Appl. No.: 13/427,263

(22) Filed: Mar. 22, 2012

(65) Prior Publication Data

US 2013/0021848 A1 Jan. 24, 2013

(30) Foreign Application Priority Data

Jul. 20, 2011 (JP) ................... 2011-158565

(51) Int. Cl.
*G11C 16/04* (2006.01)
(52) U.S. Cl.
USPC ............................... 365/185.17; 365/185.28
(58) Field of Classification Search
USPC .......................... 365/185.17, 185.28, 185.05
See application file for complete search history.

(56) References Cited

U.S. PATENT DOCUMENTS

| 8,198,672 B2 * | 6/2012 | Alsmeier ...................... 257/326 |
| 2009/0283819 A1 * | 11/2009 | Ishikawa et al. .............. 257/324 |
| 2010/0237402 A1 * | 9/2010 | Sekine et al. ................. 257/324 |
| 2010/0238733 A1 | 9/2010 | Fukuda et al. |

* cited by examiner

*Primary Examiner* — Vu Le
(74) *Attorney, Agent, or Firm* — Oblon, Spivak, McClelland, Maier & Neustadt, L.L.P.

(57) ABSTRACT

A memory cell comprises a first semiconductor layer, and a first conductive layer. The first semiconductor layer extends in a perpendicular direction with respect to a semiconductor substrate. The first conductive layer sandwiches a charge storage layer with the first semiconductor layer. A control circuit executes a first program operation and then executes a second program operation. The first program operation supplies a first voltage to the body of the memory cell and supplies a second voltage larger than the first voltage to the gate of the memory cell. The second program operation renders the body of the memory cell in a floating state and supplies a third voltage which is positive to the gate of the memory cell.

20 Claims, 12 Drawing Sheets

Regarding Memory Transistors MTr1-8
for Which Execution of Write Operation
(Program) is Complete

NONVOLATILE SEMICONDUCTOR MEMORY DEVICE AND METHOD OF DATA WRITE THEREIN

CROSS REFERENCE TO RELATED APPLICATION

This application is based upon and claims the benefit of priority from the prior Japanese Patent Application No. 2011-158565, filed on Jul. 20, 2011, the entire contents of which are incorporated herein by reference.

BACKGROUND

1. Field

The embodiments relate to an electrically data rewritable nonvolatile semiconductor memory device, and a method of data write therein.

2. Background

Stacking of memory cells is expected to improve bit density in nonvolatile semiconductor memory devices such as NAND type flash memories. Proposed as an example of such a device is a stacked type NAND flash memory in which vertical transistors are used to configure memory transistors.

However, data retention characteristics in current stacked type NAND flash memories are not sufficiently high.

DETAILED DESCRIPTION

A nonvolatile semiconductor memory device according to an embodiment comprises a semiconductor substrate, a memory cell array, and a control circuit. The memory cell array includes a plurality of memory cells stacked on the semiconductor substrate. The control circuit controls a voltage supplied to the plurality of memory cells. Each of the memory cells comprises a first semiconductor layer, a charge storage layer, and a first conductive layer. The first semiconductor layer extends in a perpendicular direction with respect to the semiconductor substrate and functions as a body of the memory cell. The charge storage layer is provided on a side surface of the first semiconductor layer. The first conductive layer is provided so as to sandwich the charge storage layer with the first semiconductor layer and functions as a gate of the memory cell. The control circuit executes a first program operation and then executes a second program operation. The first program operation is an operation that supplies a first voltage to the body of the memory cell and supplies a second voltage larger than the first voltage to the gate of the memory cell. The second program operation is an operation that renders the body of the memory cell in a floating state and supplies a third voltage which is positive to the gate of the memory cell.

A nonvolatile semiconductor memory device according to an embodiment is described below with reference to the drawings.

First Embodiment

[Schematic Configuration]

Figure 1:
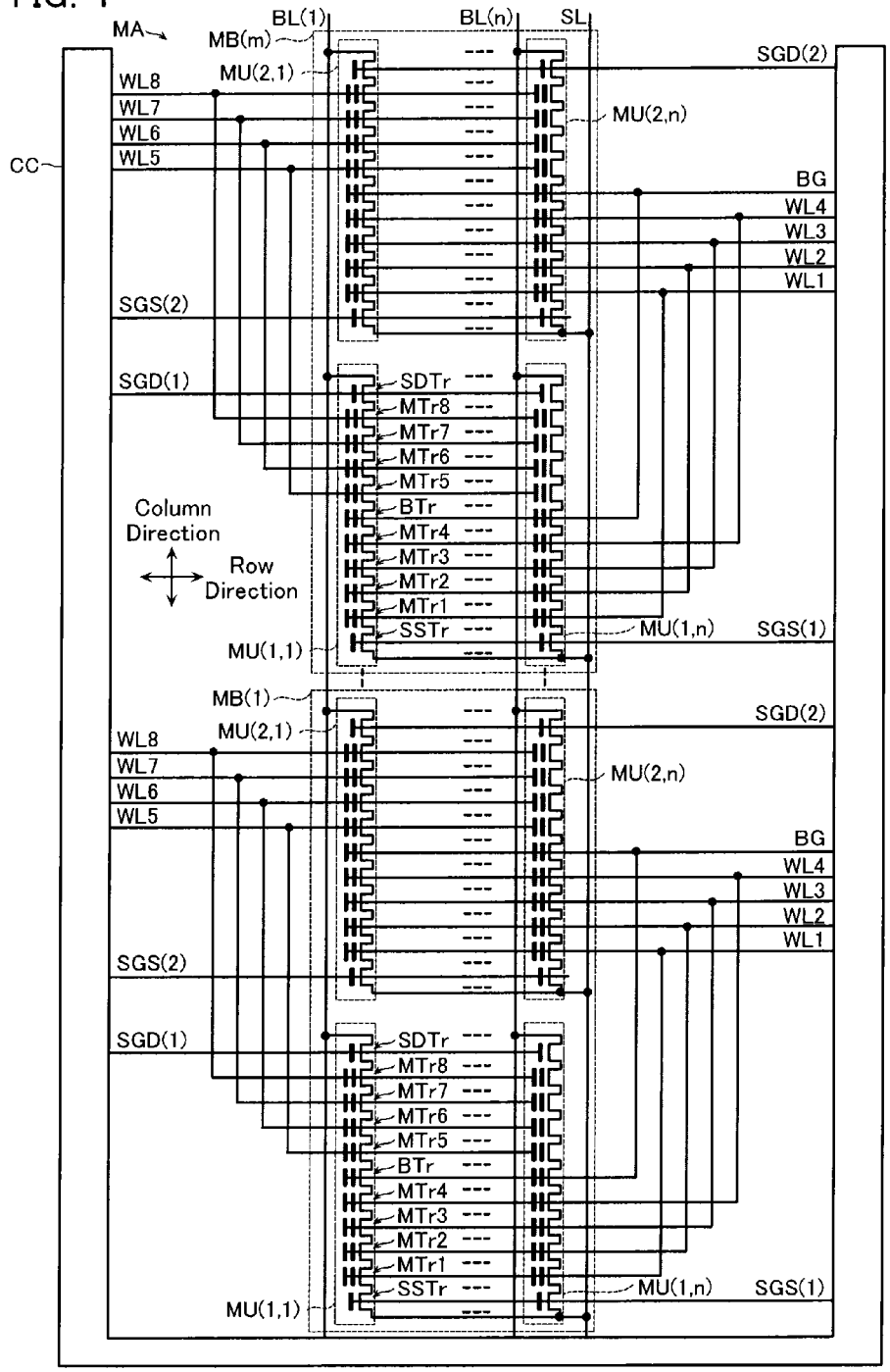
FIG. 1 is a view showing a memory cell array MA and a peripheral circuit CC in a nonvolatile semiconductor memory device according to a first embodiment.

First, a schematic configuration of a nonvolatile semiconductor memory device according to a first embodiment is described with reference to FIG. 1. As shown in FIG. 1, the nonvolatile semiconductor memory device according to the first embodiment comprises a memory cell array MA and a peripheral circuit (control circuit) CC. The peripheral circuit CC controls a voltage applied to memory transistors included in the memory cell array MA, for example.

As shown in FIG. 1, the memory cell array MA includes m memory blocks MB(1), ..., MB(m). Note that, hereinafter, memory blocks MB is sometimes used as a general term indicating all of the memory blocks MB(1), ..., MB(m).

Each of the memory blocks MB includes memory units MU(1,1)-MU(2,$n$) arranged in a matrix of n rows by two columns, respectively. The numbers of rows and columns, that is n rows and two columns, is purely an example, and the present invention is not limited to these numbers. Hereinafter, when there is no need to distinguish between each of the memory units MU(1,1)-MU(2,$n$), they are sometimes referred to simply as memory units MU.

One ends of the memory units MU(1,1)-(2,$n$) are connected to, respectively, bit lines BL(1)-($n$), and the other ends of the memory units MU(1,1)-(2,$n$) are connected to a source line SL. The bit lines BL(1)-($n$) extend in a column direction straddling a plurality of memory blocks MB and have a certain pitch in a row direction. Hereinafter, bit lines BL is sometimes used as a general term indicating all of the bit lines BL(1), ..., BL(n).

Each of the memory units MU includes a memory string MS, a source side select transistor SSTr, and a drain side select transistor SDTr.

Figure 2:
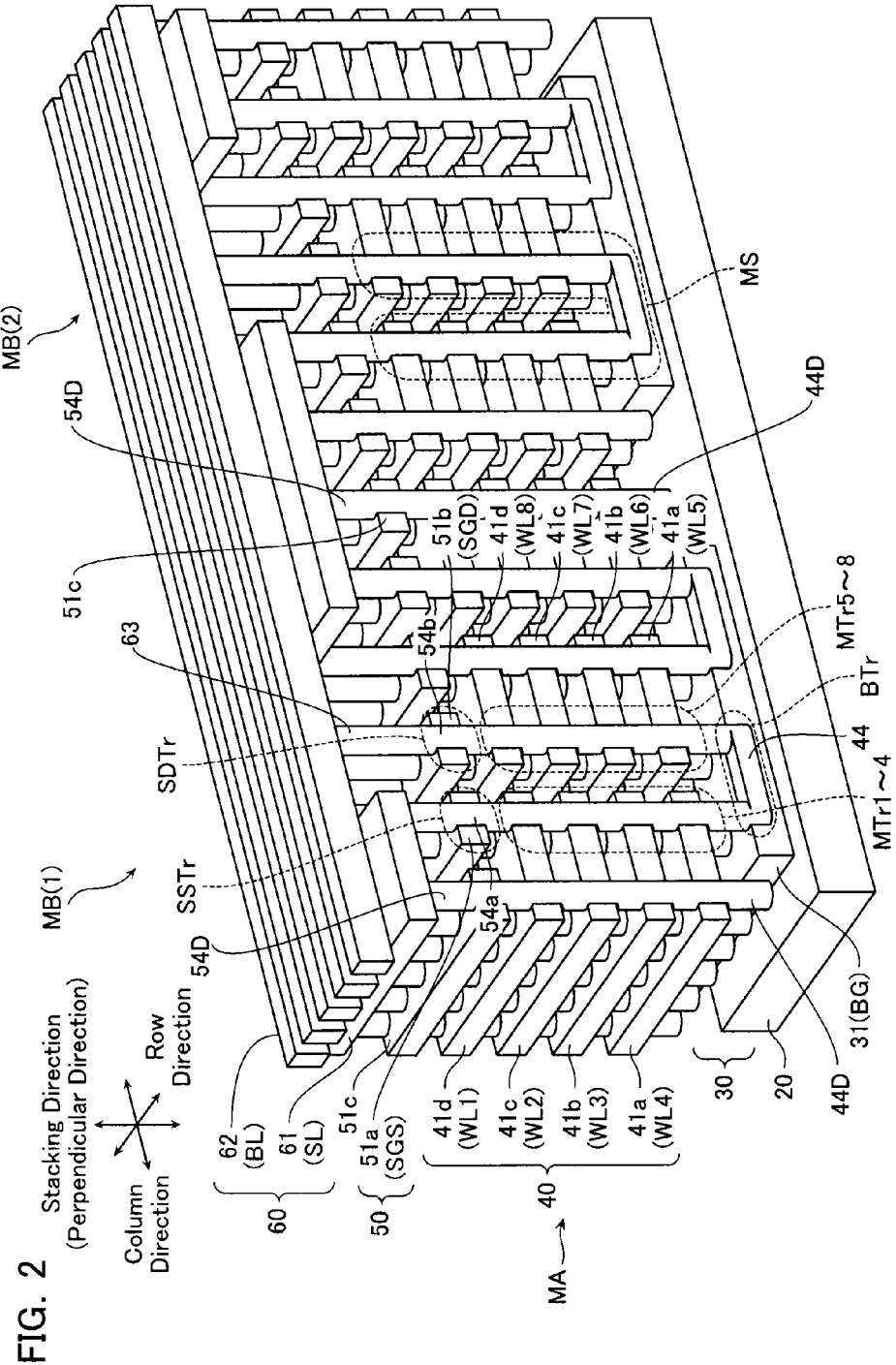
FIG. 2 is a perspective view showing a stacking structure of the memory cell array MA according to the first embodiment.

As shown in FIG. 1, the memory string MS includes memory transistors MTr1-8 (memory cells) and a back gate transistor BTr connected in series. The memory transistors MTr1-4 and MTr5-8 are each connected in series. The back gate transistor BTr is connected between the memory transistor MTr4 and the memory transistor MTr5. Note that, as shown in FIG. 2 to be described later, the memory transistors MTr1-8 are arranged three-dimensionally in the row direction, the column direction, and a stacking direction.

The memory transistors MTr1-8 retain data by storing a charge in their charge storage layer. The back gate transistor BTr is rendered in a conductive state at least when the memory string MS is selected as object of an operation.

In the memory blocks MB(1)-(m), word lines WL1-8 are commonly connected to, respectively, gates of the memory transistors MTr1-8 arranged in a matrix of n rows by two columns. A back gate line BG is commonly connected to gates of the n rows by two columns of back gate transistors BTr.

A drain of the source side select transistor SSTr is connected to a source of the memory string MS. A source of the source side select transistor SSTr is connected to the source line SL. In each of the memory blocks MB, one source side select gate line SGS(1) or SGS(2) is commonly connected to gates of the n source side select transistors SSTr aligned in one column in the row direction. Note that, hereinafter, the source side select gate lines SGS(1) and (2) are sometimes referred to without distinction using the general term source side select gate line SGS.

A source of the drain side select transistor SDTr is connected to a drain of the memory string MS. A drain of the drain side select transistor SDTr is connected to the bit line BL. In each of the memory blocks MB, one drain side select gate line SGD(1) or SGD(2) is commonly connected to gates of the n drain side select transistors SDTr aligned in one column in the row direction. Note that, hereinafter, the drain side select gate lines SGD(1) and (2) are sometimes referred to without distinction using the general term drain side select gate line SGD.

[Stacking Structure]

Figure 3:
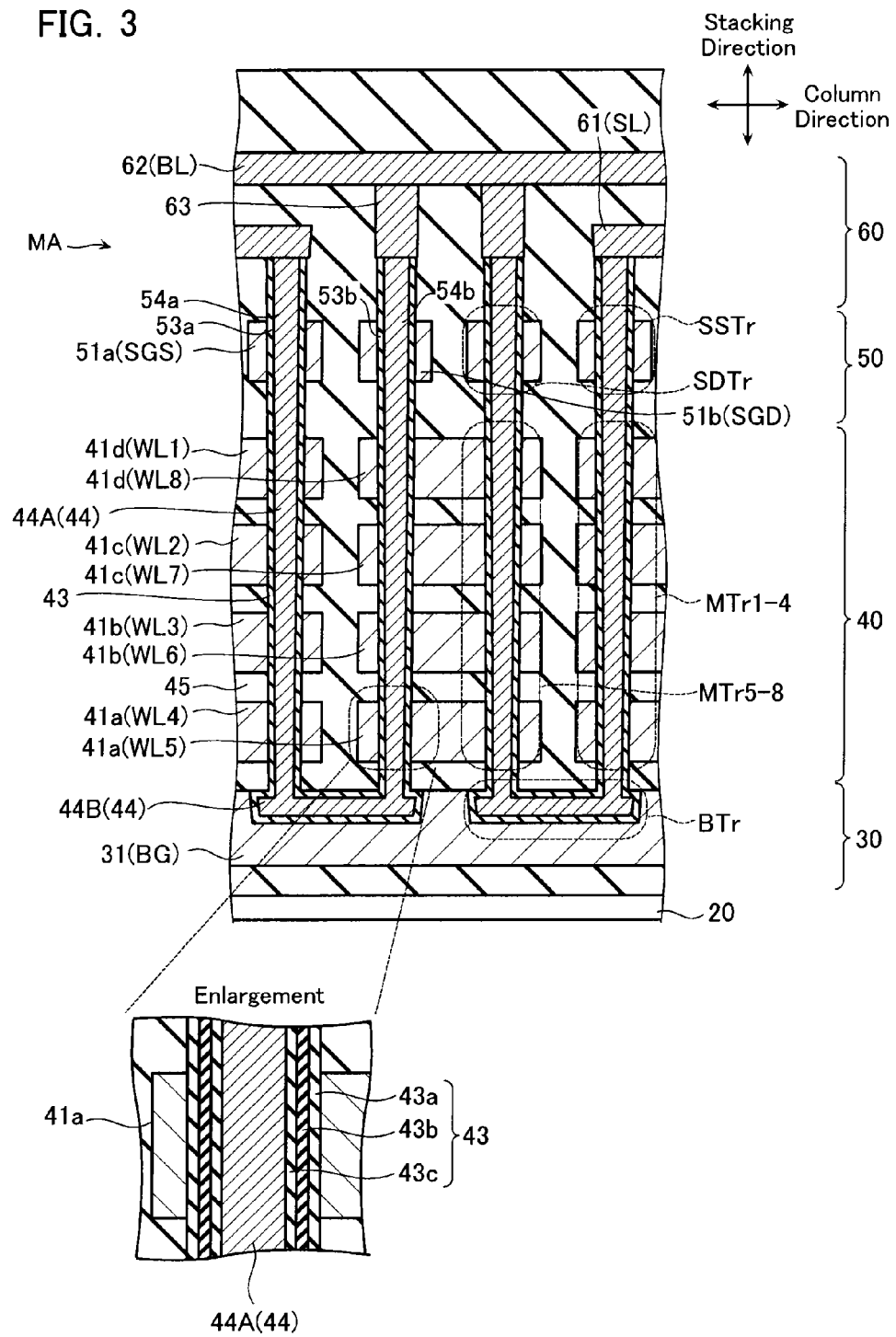
FIG. 3 is a cross-sectional view showing the stacking structure of the memory cell array MA according to the first embodiment.

As shown in FIGS. 2 and 3, one memory block MB includes, stacked sequentially on a semiconductor substrate 20, a back gate layer 30, a memory layer 40, a select transistor layer 50, and a wiring layer 60. The back gate layer 30 functions as the back gate transistor BTr. The memory layer 40 functions as the memory transistors MTr1-8. The select transistor layer 50 functions as the drain side select transistor SDTr and the source side select transistor SSTr. The wiring layer 60 functions as the source line SL and the bit line BL.

As shown in FIGS. 2 and 3, the back gate layer 30 includes a back gate conductive layer 31. The back gate conductive layer 31 functions as the back gate line BG and as the gate of the back gate transistor BTr. The back gate conductive layer 31 is formed extending in a plate-like shape, two-dimensionally, in the row direction and the column direction parallel to the semiconductor substrate 20. The back gate conductive layer 31 is made from, for example, polysilicon (poly-Si).

As shown in FIG. 3, the back gate layer 30 includes a memory gate insulating layer 43 and a joining semiconductor layer 44B. The memory gate insulating layer 43 is provided between the joining semiconductor layer 44B and the back gate conductive layer 31. The joining semiconductor layer 44B functions as a body (channel) of the back gate transistor BTr. The joining semiconductor layer 44B is formed digging out the back gate conductive layer 31. The joining semiconductor layer 44B is formed in a substantially rectangular shape having the column direction as a long direction as viewed from an upper surface. The joining semiconductor layer 44B is formed in a matrix in the row direction and the column direction in one memory block MB. The joining semiconductor layer 44B is made from, for example, polysilicon (poly-Si).

As shown in FIGS. 2 and 3, the memory layer 40 is formed in a layer above the back gate layer 30. The memory layer 40 includes four layers of word line conductive layers 41a-41d. The word line conductive layer 41a functions as a word line WL4 and as a gate of the memory transistor MTr4. In addition, the word line conductive layer 41a functions as a word line WL5 and as a gate of the memory transistor MTr5. Similarly, the word line conductive layers 41b-41d function as, respectively, word lines WL3-1 and gates of the memory transistors MTr3-1, and, in addition, as, respectively, word lines WL6-8 and gates of the memory transistors MTr6-8.

The word line conductive layers 41a-41d are stacked sandwiching an interlayer insulating layer 45 therebetween, above and below. The word line conductive layers 41a-41d are formed extending with the row direction (direction perpendicular to the plane of paper in FIG. 3) as a long direction and having a certain pitch in the column direction. The word line conductive layers 41a-41d are made from, for example, polysilicon (poly-Si).

As shown in FIGS. 2 and 3, the memory layer 40 includes the memory gate insulating layer 43, a columnar semiconductor layer 44A, and a dummy semiconductor layer 44D. The memory gate insulating layer 43 is provided between the columnar semiconductor layer 44A and the word line conductive layers 41a-41d. The columnar semiconductor layer 44A functions as a body (channel) of the memory transistors MTr1-8. The dummy semiconductor layer 44D does not function as a body of the memory transistors MTr1-8.

The memory gate insulating layer 43 includes, from a side surface of the word line conductive layers 41a-41d side to a columnar semiconductor layer 44A side, a block insulating layer 43a, a charge storage layer 43b, and a tunnel insulating layer 43c. The charge storage layer 43b is configured capable of storing a charge.

The block insulating layer 43a is formed with a certain thickness on a side wall of the word line conductive layers 41a-41d. The charge storage layer 43b is formed with a certain thickness on a side wall of the block insulating layer 43a. The tunnel insulating layer 43c is formed with a certain thickness on a side wall of the charge storage layer 43b. The block insulating layer 43a and the tunnel insulating layer 43c are made from silicon oxide ($SiO_2$). The charge storage layer 43b is made from silicon nitride (SiN).

The columnar semiconductor layer 44A is formed penetrating the word line conductive layers 41a-41d and the interlayer insulating layer 45. The columnar semiconductor layer 44A extends in the perpendicular direction with respect to the semiconductor substrate 20. A pair of the columnar semiconductor layers 44A are formed aligning with end vicinities in the column direction of the joining semiconductor layer 44B. The columnar semiconductor layer 44A is made from, for example, polysilicon (poly-Si). Note that the dummy semiconductor layer 44D is formed penetrating the word line conductive layers 41a-41d and the interlayer insulating layer 45. The back gate conductive layer 31 is not provided beneath the dummy semiconductor layer 44D.

In the above-described back gate layer 30 and memory layer 40, the pair of columnar semiconductor layers 44A and the joining semiconductor layer 44B joining lower ends of the pair of columnar semiconductor layers 44A configure a memory semiconductor layer 44 which functions as a body (channel) of the memory string MS.

Expressing the above-described configuration of the back gate layer 30 in other words, the back gate conductive layer 31 is formed surrounding side surfaces and a lower surface of the joining semiconductor layer 44B via the memory gate insulating layer 43. Moreover, expressing the above-described configuration of the memory layer 40 in other words, the word line conductive layers 41a-41d are formed surrounding a side surface of the columnar semiconductor layer 44A via the memory gate insulating layer 43.

As shown in FIGS. 2 and 3, the select transistor layer 50 includes a source side conductive layer 51a, a drain side conductive layer 51b, and a dummy conductive layer 51c. The source side conductive layer 51a functions as the source side select gate line SGS and as a gate of the source side select transistor SSTr. The drain side conductive layer 51b functions as the drain side select gate line SGD and as a gate of the drain side select transistor SDTr. The dummy conductive layer 51c does not function as the source side select gate line SGS and the drain side select gate line SGD.

The source side conductive layer 51a is formed in a layer above one of the columnar semiconductor layers 44A configuring the memory conductive layer 44. The drain side conductive layer 51b is formed in the same layer as the source side conductive layer 51a, in a layer above the other of the columnar semiconductor layers 44A configuring the memory conductive layer 44. The dummy conductive layer 51c is provided in the same layer as the source side conductive layer 51a, at places other than in layers above the columnar semiconductor layers 44A. A plurality of the source side conductive layers 51a, the drain side conductive layers 51b, and the dummy conductive layers 51c are formed extending in the row direction having a certain pitch in the column direction. The source side conductive layer 51a and the drain side conductive layer 51b are made from, for example, polysilicon (poly-Si).

As shown in FIG. 3, the select transistor layer 50 includes a source side gate insulating layer 53a, a source side columnar semiconductor layer 54a, a drain side gate insulating layer 53b, a drain side columnar semiconductor layer 54b, and a dummy semiconductor layer 54D. The source side columnar semiconductor layer 54a functions as a body (channel) of the source side select transistor SSTr. The drain side columnar semiconductor layer 54b functions as a body (channel) of the drain side select transistor SDTr.

The source side gate insulating layer 53a is provided between the source side conductive layer 51a and the source side columnar semiconductor layer 54a. The source side columnar semiconductor layer 54a is formed penetrating the source side conductive layer 51a. The source side columnar semiconductor layer 54a is formed in a column shape extending in the perpendicular direction with respect to the semiconductor substrate 20 and is connected to a side surface of the source side gate insulating layer 53a and an upper surface of one of the pair of columnar semiconductor layers 44A. The source side columnar semiconductor layer 54a is made from, for example, polysilicon (poly-Si).

The drain side gate insulating layer 53b is provided between the drain side conductive layer 51b and the drain side columnar semiconductor layer 54b. The drain side columnar semiconductor layer 54b is formed penetrating the drain side conductive layer 51b. The drain side columnar semiconductor layer 54b is formed in a column shape extending in the perpendicular direction with respect to the semiconductor substrate 20 and is connected to a side surface of the drain side gate insulating layer 53b and an upper surface of the other of the pair of columnar semiconductor layers 44A. The drain side columnar semiconductor layer 54b is made from, for example, polysilicon (poly-Si).

The dummy semiconductor layer 54D is formed penetrating the dummy conductive layer 51c. The dummy semiconductor layer 54D is formed in an I shape. A lower surface of the dummy semiconductor layer 54D is in contact with an upper surface of the dummy semiconductor layer 44D.

The wiring layer 60 includes a source line layer 61, a bit line layer 62, and a plug layer 63. The source line layer 61 functions as the source line SL. The bit line layer 62 functions as the bit line BL.

The source line layer 61 is formed extending in the row direction and in contact with an upper surface of the source side columnar semiconductor layer 54a. The bit line layer 62 is formed extending in the column direction and in contact with an upper surface of the drain side columnar semiconductor layer 54b via the plug layer 63. The source line layer 61, the bit line layer 62, and the plug layer 63 are made from, for example, a metal such as tungsten (W).

[Operation]

Next, a write operation in the first embodiment is described. The write operation in the present embodiment includes a first program operation, a second program operation, and a write verify operation. The first program operation is an operation for writing data to the memory transistors MTr1-8. For example, when writing "0" data (binary data), a threshold voltage distribution of the memory transistors MTr1-8 is shifted in the positive direction in accordance with "0" data.

The second program operation is executed after the first program operation. This second program operation is an operation for suppressing degradation of data retained in the memory transistors MTr1-8. The write verify operation is an operation for judging whether a threshold voltage of the memory transistors MTr1-8 has attained a certain value or not.

Figure 4:
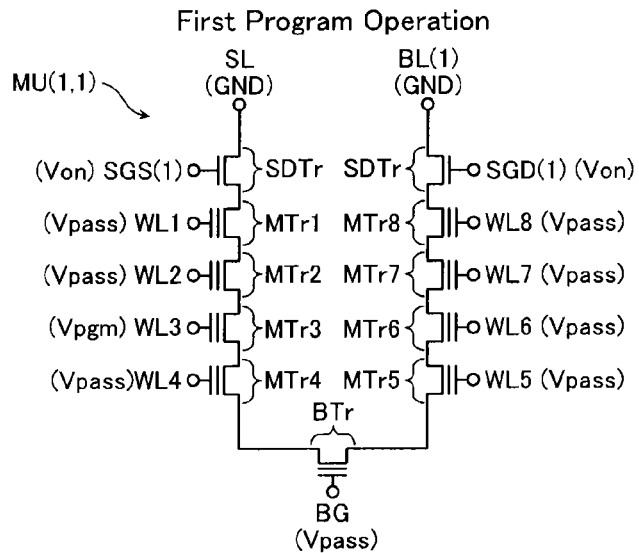
FIG. 4 is a schematic view of a first program operation according to the first embodiment.

First, the first program operation is described with reference to FIG. 4. FIG. 4 shows one example where the first program operation is executed on a selected memory transistor MTr3 in a selected memory string MS(1,1). Note that, although not shown in FIG. 4, the first program operation in the example shown in FIG. 4 is executed simultaneously on a plurality of selected memory transistors MTr3 connected to one selected word line WL3 in the memory strings MS(1,1)-(1,n).

As shown in FIG. 4, in the first program operation, the peripheral circuit CC sets a voltage of the bit line BL(1) and the source line SL to a ground voltage GND. The peripheral circuit CC applies an on voltage Von to the source side select gate line SGS(1) and the drain side select gate line SGD(1). As a result, the source side select transistor SSTr and the drain side select transistor SDTr attain a conductive state. The peripheral circuit CC applies a pass voltage Vpass to unselected word lines WL1, 2, and 4-8, and to the back gate line BG. The pass voltage Vpass is a voltage that renders the memory transistors MTr1-8 in a conductive state irrespective of retained data of the memory transistors MTr1-8. Therefore, the unselected memory transistors MTr1, 2, and 4-8, and the back gate transistor BTr attain a conductive state, and a voltage of their bodies is set to close to the ground voltage GND via the bit line BL(1) and the source line SL. Then, the peripheral circuit CC applies a program voltage Vpgm to the selected word line WL3. As a result, a potential difference between the gate and the body of the selected memory transistor MTr3 is set high. Note that the program voltage Vpgm is larger than the pass voltage Vpass.

Figure 5A:
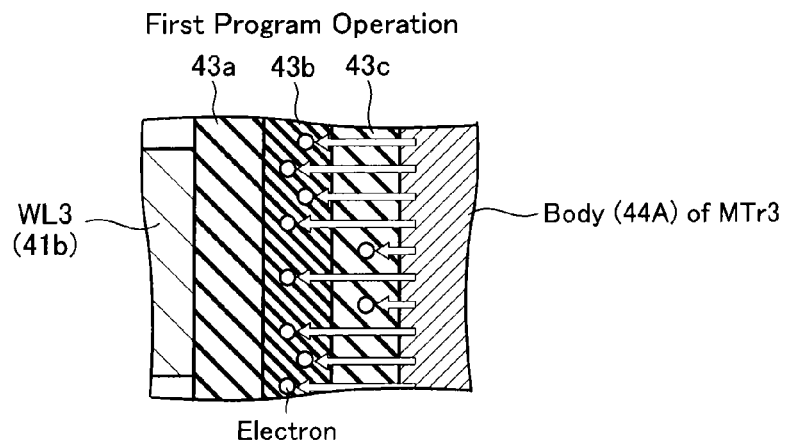
FIGS. 5A and 5B are views showing migration of electrons due to the first program operation according to the first embodiment.
Figure 5B:
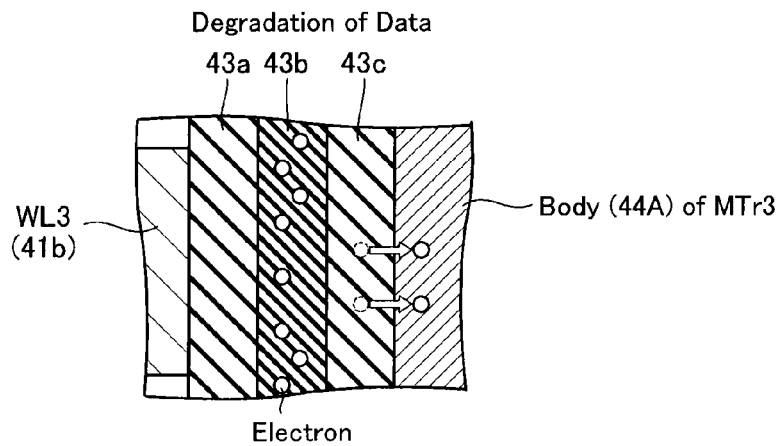

The above applied voltages shown in FIG. 4 cause electrons from the columnar semiconductor layer 44A (body) to be trapped in the charge storage layer 43b of the selected memory transistor MTr3 as shown in FIG. 5A. This causes the threshold voltage of the selected memory transistor MTr3 to shift in a positive direction. However, at this time, electrons are trapped also in the tunnel insulating layer 43c of the selected memory transistor MTr3. As time passes, the electrons trapped in this tunnel insulating layer 43c return to the columnar semiconductor layer 44A (body) (the electrons are detrapped) as shown in FIG. 5B, whereby the threshold voltage of the selected memory transistor MTr3 is lowered. That is, data retained in the selected memory transistor MTr3 is sometimes degraded.

Figure 6:
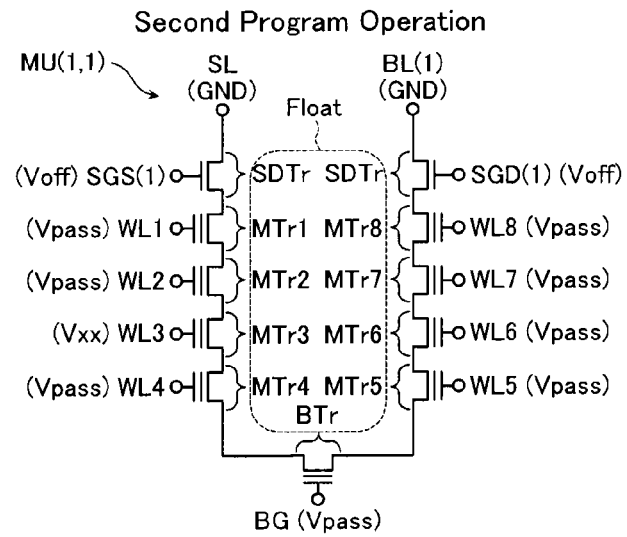
FIG. 6 is a schematic view of a second program operation according to the first embodiment.
Figure 7:
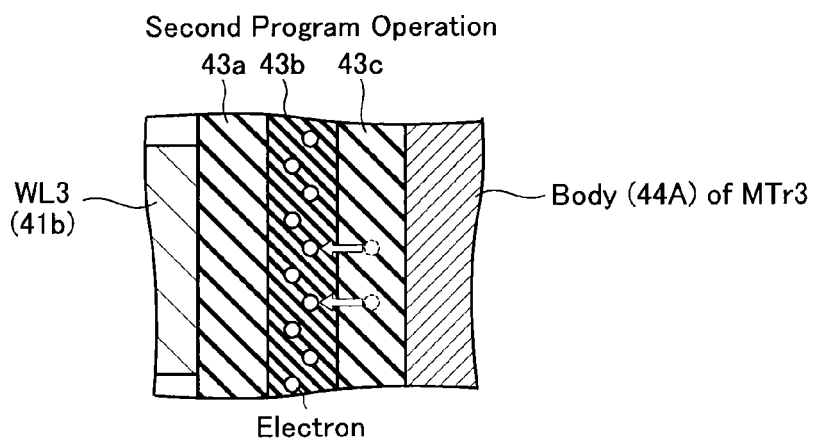
FIG. 7 is view showing migration of electrons due to the second program operation according to the first embodiment.

Hence, in the write operation in the first embodiment, the second program operation is executed after the first program operation. FIG. 6 shows one example where the second program operation is executed on the selected memory transistor MTr3 in the selected memory string MS(1,1). Note that, although not shown in FIG. 6, the second program operation in the example shown in FIG. 6 is executed simultaneously on a plurality of selected memory transistors MTr3 connected to one selected word line WL3 in the memory strings MS(1,1)-(1,n).

As shown in FIG. 6, in the second program operation, the peripheral circuit CC sets a voltage of the bit line BL (1) and the source line SL to the ground voltage GND. The peripheral circuit CC applies an off voltage Voff to the source side select gate line SGS(1) and the drain side select gate line SGD(1). As a result, the source side select transistor SSTr and the drain side select transistor SDTr are rendered in a non-conductive state. This causes the body of the memory transistors MTr1-8 to attain a floating state. Then, the peripheral circuit CC applies the pass voltage Vpass to unselected word lines WL1, 2, and 4-8, and applies a positive program voltage Vxx to the selected word line WL3. Therefore, coupling accompanying application of these pass voltage Vpass and program voltage Vxx causes the voltage of the body of the selected memory transistor MTr3 to rise. As a result, a potential difference between the gate and the body of the selected memory transistor MTr3 is set lower during the second program operation than during the first program operation.

The program voltage Vxx herein need only be a voltage required to push the electrons trapped in the tunnel insulating layer 43c into the charge storage layer 43b, for example, a voltage larger than a verify voltage to be described later and smaller than a stepped-up voltage Vpam(n) incremented a maximum number of times n in an ISPP system.

The above applied voltages shown in FIG. 6 cause the electrons trapped in the tunnel insulating layer 43c to be pushed into the charge storage layer 43b. Meanwhile, bodies of the memory transistors MTr1-8 are in the floating state, hence migration of electrons from the body (columnar semiconductor layer 44A) of the memory transistor MTr3 to the tunnel insulating layer 43c and the charge storage layer 43b can be prohibited. This allows the first embodiment to suppress detrapping such as that shown in FIG. 5B and thereby suppress data degradation.

Figure 8:
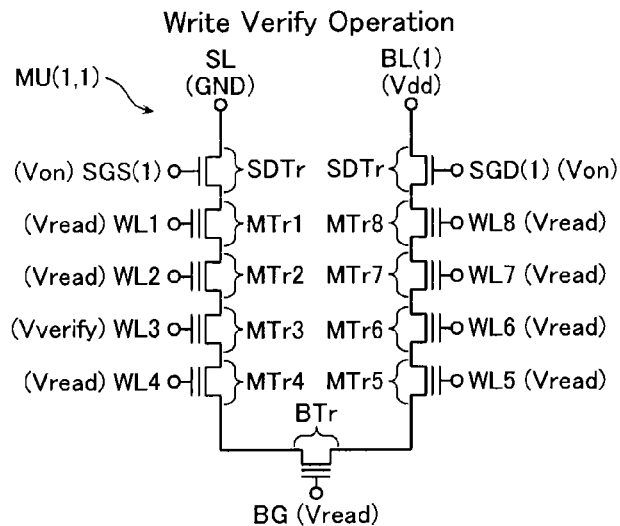
FIG. 8 is a schematic view of a write verify operation according to the first embodiment.

Next, the write verify operation is described with reference to FIG. 8. FIG. 8 shows one example where the write verify operation is executed on the selected memory transistor MTr3 in the selected memory string MS(1,1). Note that, although not shown in FIG. 8, the write verify operation in the example shown in FIG. 8 is executed simultaneously on a plurality of selected memory transistors MTr3 connected to one selected word line WL3 in the memory strings MS(1,1)-(1,n).

As shown in FIG. 8, in the write verify operation, the peripheral circuit CC applies the on voltage Von to the source side select gate line SGS(1) and the drain side select gate line SGD(1). As a result, the source side select transistor SSTr and the drain side select transistor SDTr are set to a conductive state. Then, the peripheral circuit CC applies a read voltage Vread to unselected word lines WL1, 2, and 4-8, and to the back gate line BG. The unselected memory transistors MTr1, 2, and 4-8, and the back gate transistor BTr are set to a conductive state. Meanwhile, the peripheral circuit CC applies a verify voltage Vverify to the selected word line WL3, and sets the selected memory transistor MTr3 to a conductive state or a non-conductive state according to data. The peripheral circuit CC judges a fail (write failure) in the case that a certain current flows from the bit line BL(1) to the source line SL, and, on the other hand, judges a pass (write success) in the case that a certain current does not flow from the bit line BL(1) to the source line SL.

Next, an overall flow of the write operation according to the present embodiment is described with reference to FIG. 9. For convenience of explanation, a write operation of the ISPP system shown in FIG. 9 is executed on the memory transistor MTr3 connected to one selected word line WL3.

Figure 9:
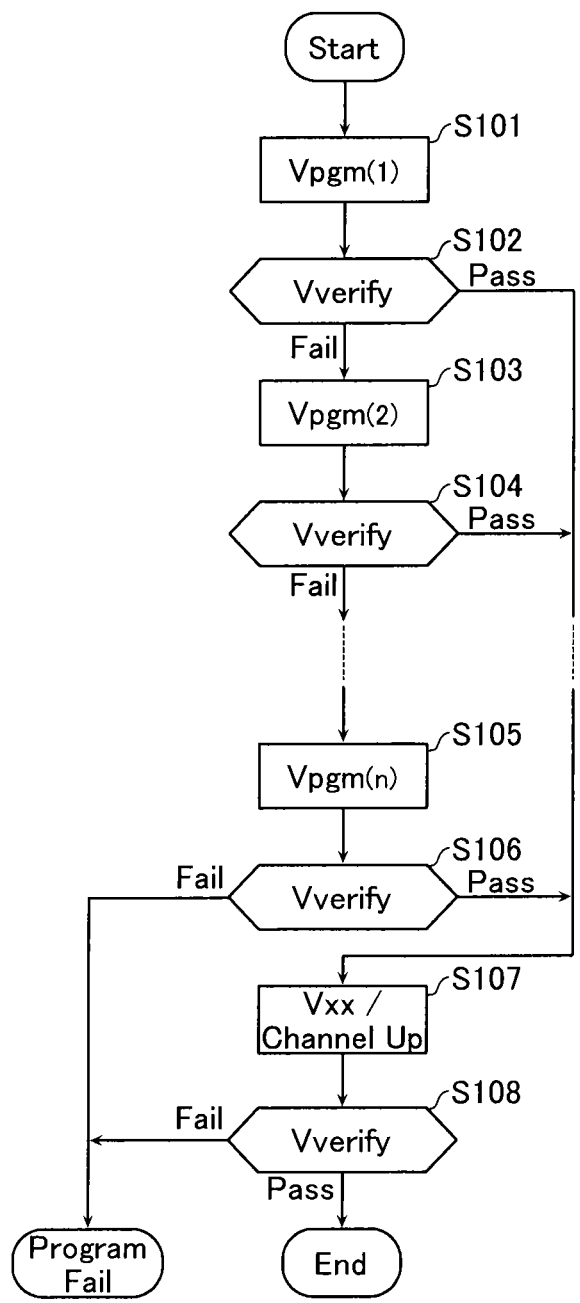
FIG. 9 is a flowchart showing a write operation according to the first embodiment.

As shown in FIG. 9, first, the peripheral circuit CC executes the first program operation using a program voltage Vpgm(1), on the memory transistor MTr3 (S101).

Then, the peripheral circuit CC executes the write verify operation using the verify voltage Vverify (S102). The peripheral circuit CC, in the case of judging a pass in this step S102 (Pass in S102), executes the second program operation (S107).

On the other hand, the peripheral circuit CC, in the case of judging a fail in step S102 (Fail in S102), executes the first program operation using a program voltage Vpgm(2) (S103).

The program voltage Vpgm(2) herein has a value that is the program voltage Vpgm(1) stepped up. Subsequent to step S103, the peripheral circuit CC executes the write verify operation similar to step S102 (S104).

From step S104 onwards, the peripheral circuit CC executes the first program operation repeatedly, stepping up the program voltage Vpgm on each occasion, until a pass is judged by the write verify operation (S105). However, the peripheral circuit CC, in the case of judging a fail in the n-th time (n being a maximum number of times) write verify operation (S106) (Fail in S106), judges the write operation to be a failure.

In the case that a pass is judged in the write verify operation up to and including the n-th time of write verify operation (Pass in S102, Pass in S104, Pass in S106), the peripheral circuit CC executes the second program operation using the program voltage Vxx (step S107). Subsequently, the peripheral circuit CC executes the write verify operation (S108), and in the case that a pass is judged (Pass in S108), finishes the write operation.

Figure 10:
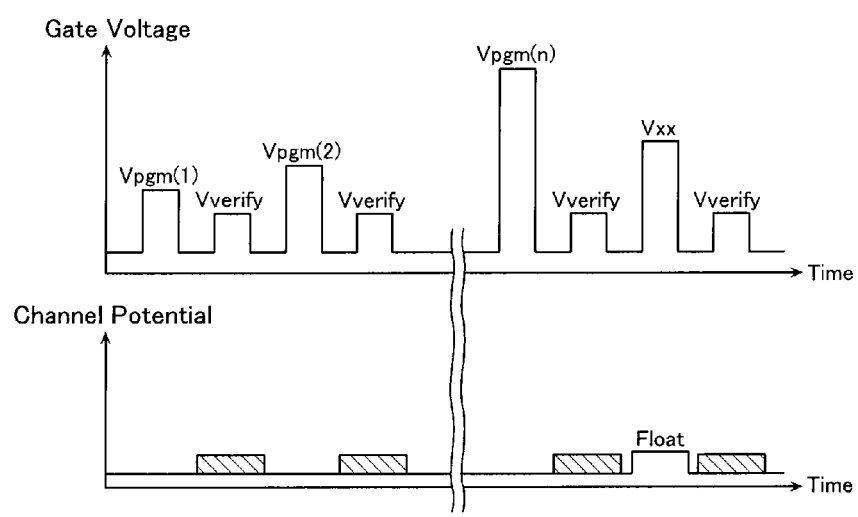
FIG. 10 is a timing chart showing the write operation according to the first embodiment.

In the case of executing steps S101-S108 shown in FIG. 9, the voltage applied to the gate of the selected memory transistor MTr3 and the potential of the body of the selected memory transistor MTr3 change as shown in FIG. 10. As shown in FIG. 10, the program voltages Vpgm(1)-(n) of the first to n-th times are stepped up. On the other hand, the write verify voltage Vverify of the first to n-th times is held constant. Moreover, the potential of the body (channel) of the selected memory transistor MTr3 set to the floating state rises due to coupling with the program voltage Vxx.

In the write operation in the present embodiment, the second program operation is executed after the first program operation. That is, subsequent to the first program operation, the second program operation for pushing electrons held in the tunnel insulating layer 43c into the charge storage layer 43b is performed. As a result, electrons detrapped to the columnar semiconductor layer 44A (body) as time passes can be reduced. Therefore, the present embodiment can provide a nonvolatile semiconductor memory device in which degradation of data is suppressed compared to the comparative example where only the first program operation is performed in the write operation.

Second Embodiment

Figure 11:
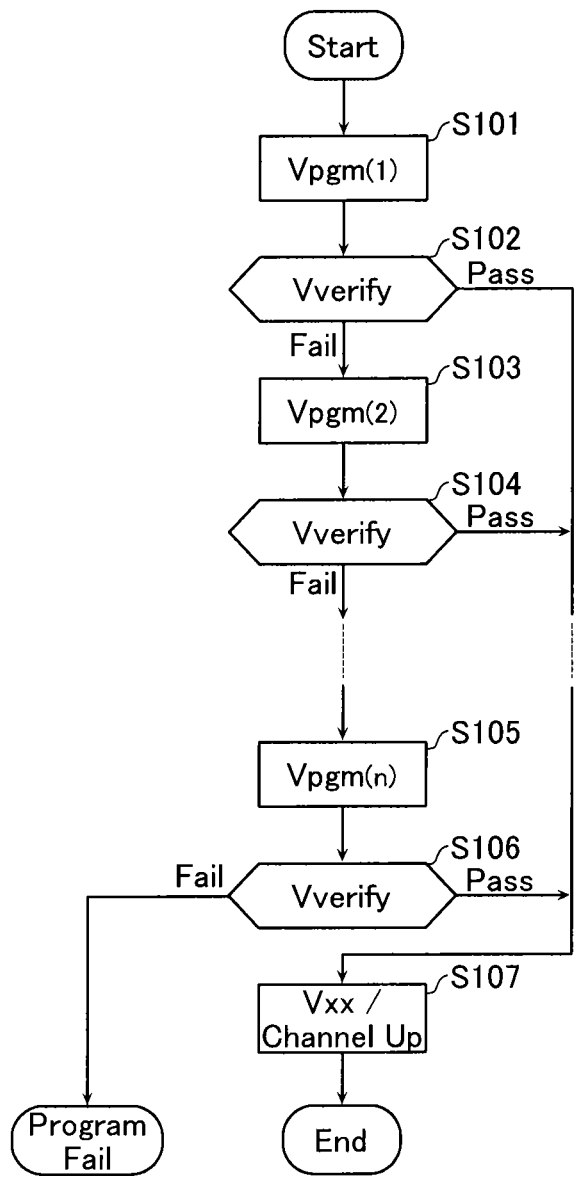
FIG. 11 is a flowchart showing a write operation according to a second embodiment.
Figure 12:
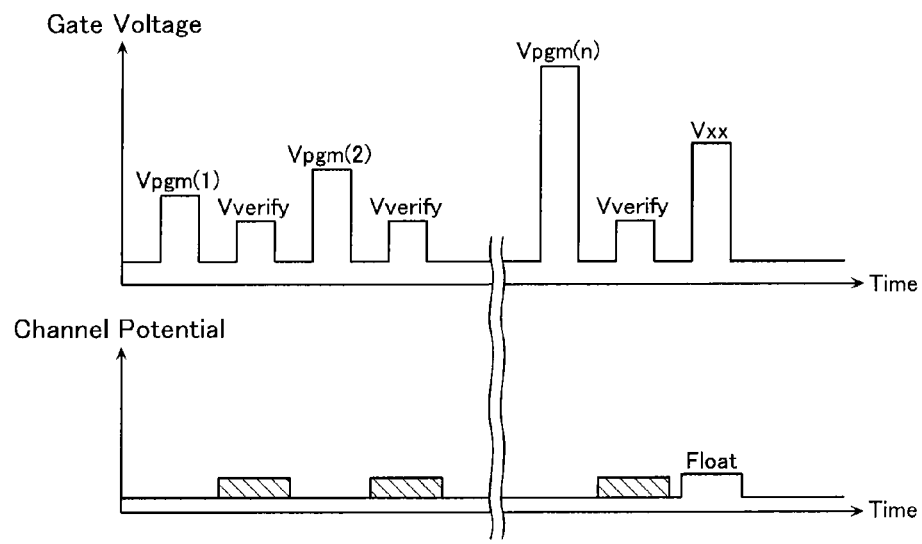
FIG. 12 is a timing chart showing the write operation according to the second embodiment.

Next, a nonvolatile semiconductor memory device according to a second embodiment is described. Note that a configuration of the second embodiment is similar to that of the first embodiment, hence a description thereof is omitted. As shown in FIGS. 11 and 12, the second embodiment does not execute the write verify operation after the second program operation (S107). The second embodiment differs from the first embodiment in this point only.

The second embodiment displays similar advantages to those of the first embodiment. In addition, the second embodiment can be applied to the case where, for example, a change in the threshold voltage of the selected memory transistor MTr3 is known in advance by the second program operation. As a result, the second embodiment allows execution time of the write operation to be reduced more than in the first embodiment, while pushing electrons retained in the tunnel insulating layer 43*c* into the charge storage layer 43*b* and thereby suppressing degradation of data similarly to in the first embodiment.

Third Embodiment

Next, a nonvolatile semiconductor memory device according to a third embodiment is described. Note that a configuration of the third embodiment is similar to that of the first embodiment, hence a description thereof is omitted. The third embodiment executes the second program operation then the write verify operation (S102, S104, S106) following each of the first program operations (S101, S103, S105) shown in FIG. 9. The second embodiment differs from the first embodiment in this point only.

Fourth Embodiment

Figure 13:
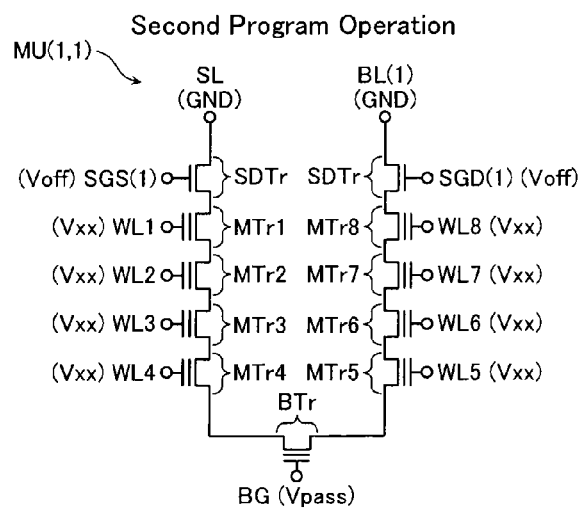
FIG. 13 is a schematic view of a second program operation according to a fourth embodiment.

Next, a nonvolatile semiconductor memory device according to a fourth embodiment is described. Note that a configuration of the fourth embodiment is similar to that of the first embodiment, hence a description thereof is omitted. As shown in FIG. 13, in the fourth embodiment, the second program operation is executed simultaneously on the plurality of memory transistors MTr1-8 (selected memory transistors MTr1-8) connected to all of the word lines WL1-8 (selected word lines WL1-8). The fourth embodiment differs in this point from the first embodiment that executes the second program operation simultaneously only on the selected memory transistors MTr3 connected to one selected word line WL3.

Specifically, as shown in FIG. 13, during the second program operation in the fourth embodiment, the peripheral circuit CC applies the off voltage Voff to the source side select gate line SGS(1) and the drain side select gate line SGD(1), whereby the source side select transistor SSTr and the drain side select transistor SDTr attain a non-conductive state. The peripheral circuit CC grounds the bit line BL(1) and the source line SL. The peripheral circuit CC applies the program voltage Vxx to the word lines WL1-8. This causes electrons trapped in the tunnel insulating layer 43*c* in the selected memory transistors MTr1-8 to migrate to the charge storage layer 43*b*. On the other hand, migration of electrons from the body (columnar semiconductor layer 44A) of the selected memory transistors MTr1-8 to the tunnel insulating layer 43*c* and charge storage layer 43*b* of the selected memory transistors MTr1-8 can be prohibited. This allows detrapping of electrons and resultant data degradation to be suppressed in the fourth embodiment.

Figure 14:
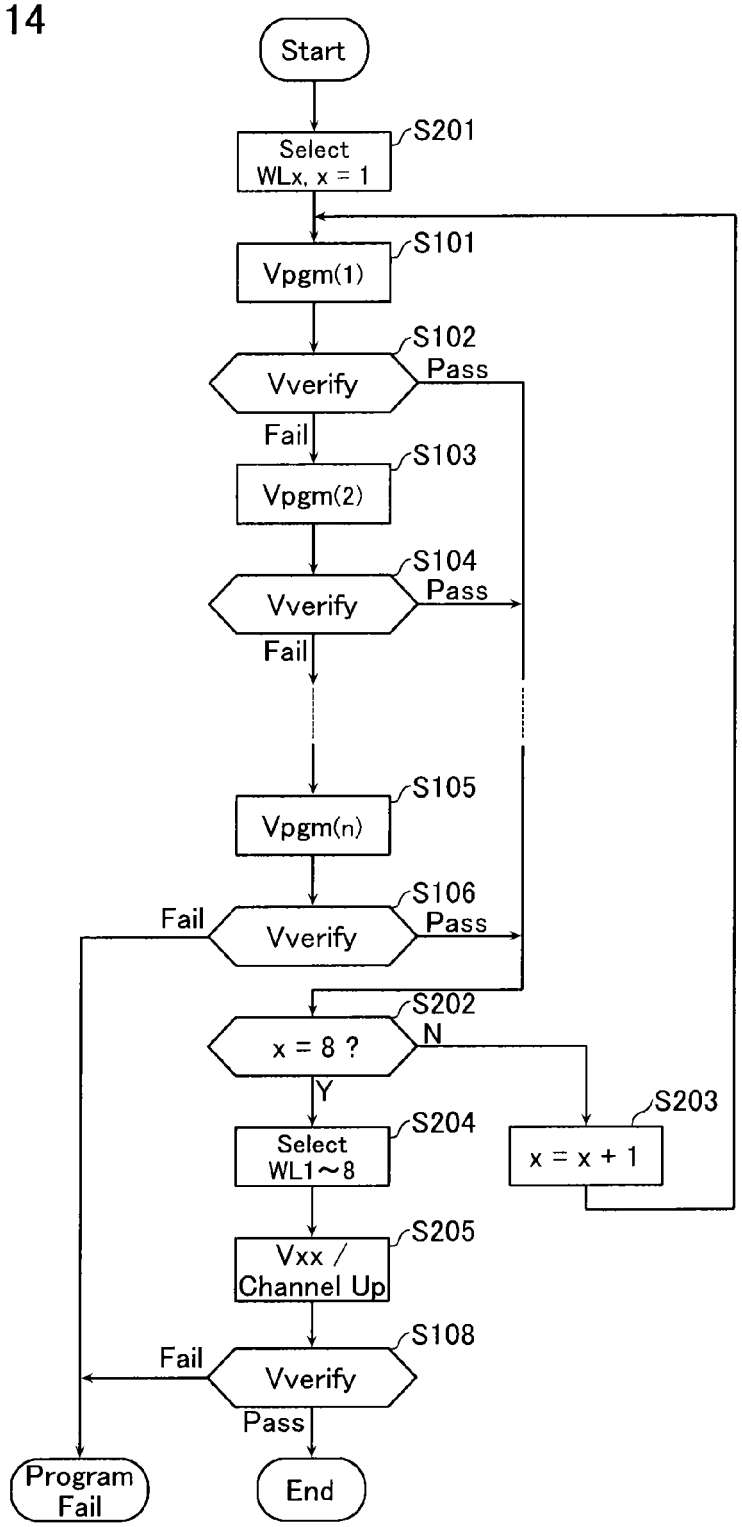
FIG. 14 is a flowchart showing a write operation according to the fourth embodiment.

Next, the write operation according to the fourth embodiment is described with reference to FIG. 14. As shown in FIG. 14, first, the peripheral circuit CC selects the word line WL1 and executes the above-described steps S101-S106 (first program operation, write verify operation) on the selected memory transistors MTr1 connected to that selected word line WL1. Then, the peripheral circuit CC selects, sequentially, the word lines WL2, 3, . . . , 8, and executes steps S101-S106 in order on the selected memory transistors MTr2, 3, . . . , 8 connected to these word lines WL2, 3, . . . , 8 (S202N, S203). Then, the peripheral circuit CC, in the case that steps S101-S106 have been executed on the selected memory transistors MTr8 connected to the selected word line WL8 (Y in step S202), selects all of the word lines WL1-8 (S204) and executes the second program operation simultaneously on the selected memory transistors MTr1-8 connected to these selected word lines WL1-8 (S205). Note that subsequent to the second program operation (S205), the peripheral circuit CC executes the write verify operation similarly to in the first embodiment (S108).

In the fourth embodiment, the second program operation is executed simultaneously on the plurality of memory transistors MTr1-8 (selected memory transistors MTr1-8) connected to all of the word lines WL1-8 (selected word lines WL1-8). Therefore, the present embodiment allows execution time of the second program operation to be reduced compared to the first embodiment in which the second program operation is performed individually on each of the respective memory transistors MTr1-8. Note that the fourth embodiment and the second embodiment may be combined.

Fifth Embodiment

Figure 15A:
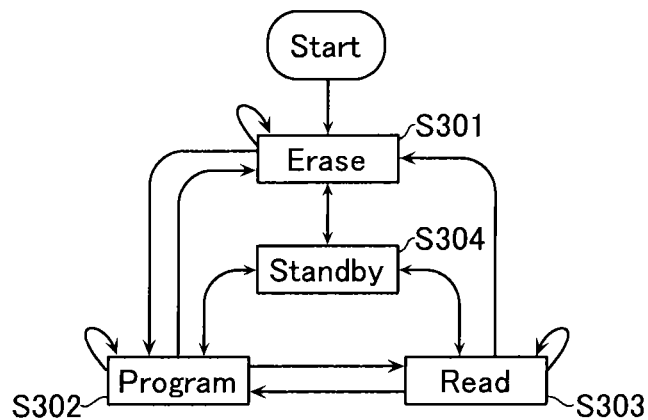
FIGS. 15A and 15B are flowcharts showing various kinds of operations according to a fifth embodiment.

Next, a nonvolatile semiconductor memory device according to a fifth embodiment is described. Note that a configuration of the fifth embodiment is similar to that of the first embodiment, hence a description thereof is omitted. As shown in FIG. 15A, in the fifth embodiment, the second program operation is executed in a standby state (S304) except for an erase operation (S301), the write operation (first program operation, write verify operation) (S302), and a read operation (S303). The fifth embodiment differs in this point from the first through fourth embodiments where the second program operation is executed during the write operation.

Figure 15B:
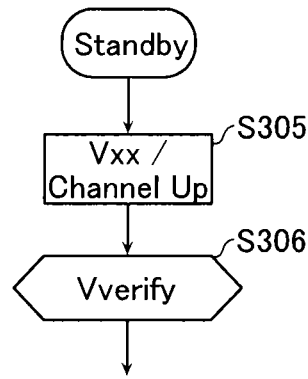

As shown in FIG. 15B, in the standby state, the peripheral circuit CC executes the second program operation on the memory transistors MTr1-8 for which execution of the write operation (first program operation, write verify operation) has been completed (S305), and then executes the write verify operation (S306).

As described above, in the fifth embodiment, the second program operation is executed in the standby state. Therefore, the fifth embodiment allows execution time of the write operation to be shortened more than in the first through fourth embodiments.

OTHER

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, the program voltage Vxx in the second program operation may have a value that is either the same as that of the program voltages Vpgm(1)-(n) in the first program operation, or larger or smaller than those program voltages Vpgm(1)-(n). In addition, the number of memory transistors MTr1-8 is not limited to eight, and may be nine or more, or seven or less.

Figure 16:
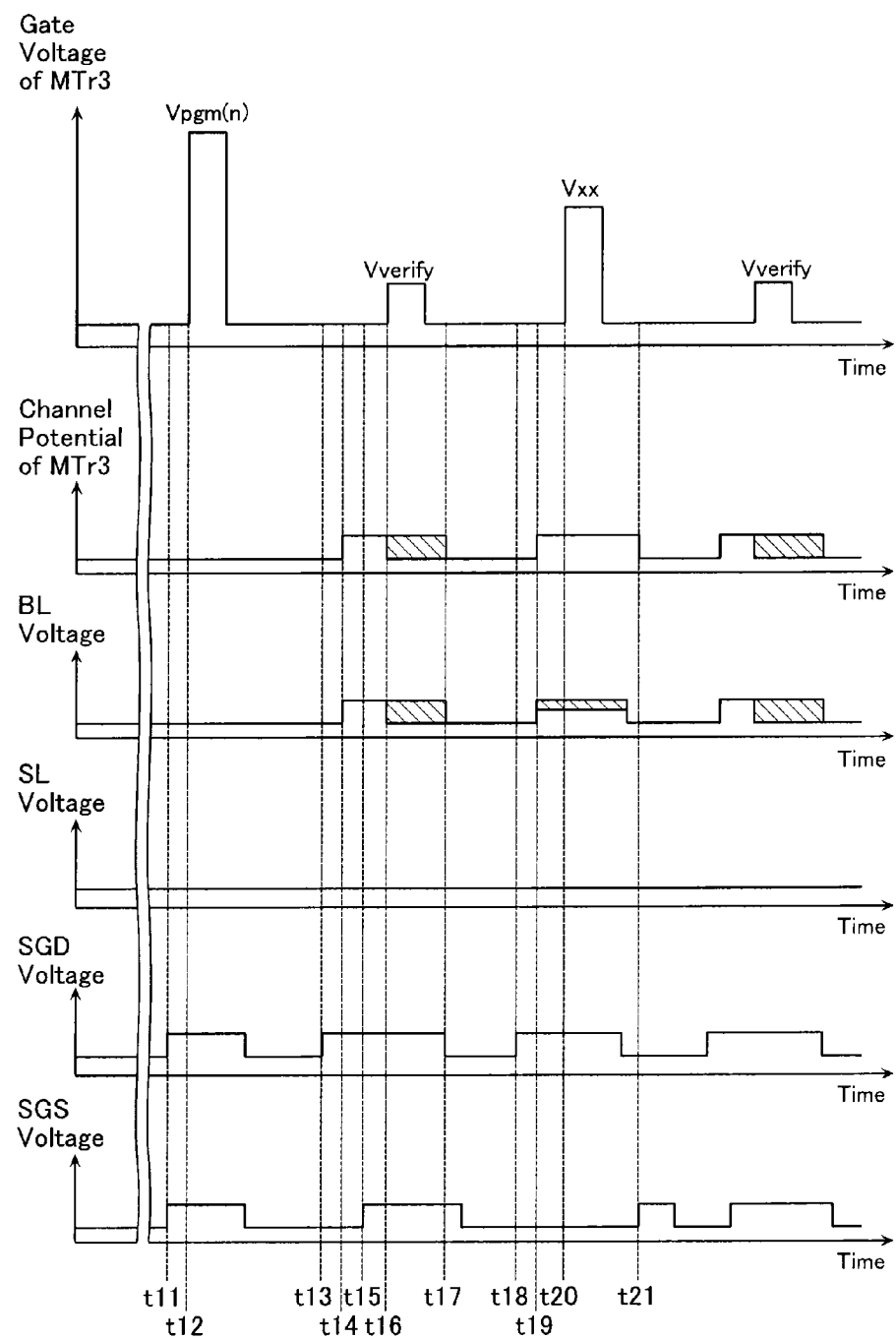
FIG. 16 is a timing chart showing the first program operation, the write verify operation, and the second program operation according to the embodiments.

For example, in the above-described embodiments, the first program operation, the write verify operation, and the second program operation may also be executed by control shown in FIG. 16. That is, as shown in FIG. 16, at time t11, a voltage of the source side select gate line SGS and a voltage of the drain side select gate line SGD are raised to set the source side select transistor SSTr and the drain side select transistor SDTr to a conductive state. Next, at time t12, a voltage of a gate of the selected memory transistor MTr3 (selected word line WL3) is raised to the program voltage Vpgm(n). As a result, the first program operation is executed on the selected memory transistor MTr3. After this first program operation, the voltage of the gate of the selected memory transistor MTr3, the voltage of the source side select gate line SGS, and the voltage of the drain side select gate line SGD are lowered.

Then, at time t13, the voltage of the drain side select gate line SGD is raised and at time t14, a voltage of the bit line BL is raised. As a result, the drain side select transistor SDTr attains a conductive state, and a voltage of a body of the selected memory transistor MTr3 rises due to charging from the bit line BL. Next, at time t15, the voltage of the source side select gate line SGS is raised, and at time t16, the voltage of the gate of the selected memory transistor MTr3 is raised to the write verify voltage Vverify. As a result, the write verify operation is executed on the selected memory transistor MTr3. This write verify operation is executed until the voltage of the drain side select gate line SGD is lowered at time t17. In time t16 to t17, if the voltages of the bit line BL and the body of the selected memory cell MTr3 do not lower, a pass is judged, and if those voltages lower, a fail is judged. Note that after execution of this write verify operation, the voltage of the source side select gate line SGS is lowered.

In the case that pass is judged by the above-described write verify operation, at time t18, the voltage of the drain side select gate line SGD is raised, and at time t19, the voltage of the bit line BL is raised. As a result, the drain side select transistor SDTr attains a conductive state, and the voltage of the body of the selected memory transistor MTr3 rises due to charging from the bit line BL, after which the body of the selected memory transistor MTr3 is set to a floating state. Next, at time t20, the voltage of the gate of the selected memory transistor MTr3 is raised to the program voltage Vxx. As a result, the second program operation is executed on the selected memory transistor MTr3. After execution of this second program operation, the voltage of the gate of the selected memory transistor MTr3, the voltage of the bit line BL, and the voltage of the drain side select gate line SGD are lowered. Then, at time t21, the voltage of the source side select gate line SGS is raised, the source side select transistor SSTr is set to a conductive state, and the voltage of the body of the selected memory transistor MTr3 is discharged to the source line SL.

What is claimed is:

1. A nonvolatile semiconductor memory device, comprising:
    a semiconductor substrate;
    a memory cell array including a plurality of memory cells stacked on the semiconductor substrate; and
    a control circuit configured to control a voltage supplied to the plurality of memory cells,
    each of the memory cells comprising:
    a first semiconductor layer extending in a perpendicular direction with respect to the semiconductor substrate and functioning as a body of the memory cell;
    a charge storage layer provided on a side surface of the first semiconductor layer; and
    a first conductive layer provided so as to sandwich the charge storage layer with the first semiconductor layer and functioning as a gate of the memory cell,
    the control circuit executing a first program operation that supplies a first voltage to the body of the memory cell and supplies a second voltage larger than the first voltage to the gate of the memory cell, and then executing a second program operation that renders the body of the memory cell in a floating state and supplies a third voltage which is positive to the gate of the memory cell.

2. The nonvolatile semiconductor memory device according to claim 1, wherein
    after executing the first program operation, the control circuit executes a write verify operation to judge whether the threshold voltage of the memory cell is a first value or not,
    in the case that in the write verify operation the threshold voltage of the memory cell is judged to be the first value, the control circuit executes the second program operation, and
    in the case that in the write verify operation the threshold voltage of the memory cell is judged not to be the first value, the control circuit executes the first program operation again.

3. The nonvolatile semiconductor memory device according to claim 2, wherein
    after executing the second program operation, the control circuit executes the write verify operation.

4. The nonvolatile semiconductor memory device according to claim 1, wherein
    after executing the first program operation and the second program operation, the control circuit executes a write verify operation to judge whether the threshold voltage of the memory cell is a first value or not, and
    in the case that in the write verify operation the threshold voltage of the memory cell is judged not to be the first value, the control circuit executes the first program operation again.

5. The nonvolatile semiconductor memory device according to claim 1, wherein
    a plurality of the memory cells are connected in series, and
    during the second program operation, the control circuit supplies the third voltage simultaneously to the gates of the plurality of the memory cells connected in series.

6. The nonvolatile semiconductor memory device according to claim 5, wherein
    after executing the first program operation, the control circuit executes a write verify operation to judge whether the threshold voltage of the memory cell is a first value or not, and
    in the case that in the write verify operation the threshold voltage of the plurality of the memory cells connected in series is judged to be the first value, the control circuit executes the second program operation.

7. The nonvolatile semiconductor memory device according to claim 1, wherein the control circuit is configured capable of executing a read operation for reading data from the memory cells and an erase operation for erasing data retained in the memory cells, and the control circuit executes the second program operation during a standby state except for a time of execution of the read operation and the erase operation.

8. The nonvolatile semiconductor memory device according to claim 1, wherein after executing the first program operation, the control circuit executes a write verify operation to judge whether the threshold voltage of the memory cell is a first value or not, and when executing the first program operation again after executing the write verify operation, the control circuit steps up the second voltage.

9. The nonvolatile semiconductor memory device according to claim 1, wherein the memory cell array comprises:

a memory string having a plurality of the memory cells connected in series;

a first select transistor connected to one end of the memory string; and a second select transistor connected to the other end of the memory string, the control circuit sets the first select transistor and the second select transistor to a conductive state during the first program operation, and sets the first select transistor and the second select transistor to a non-conductive state during the second program operation.

10. The nonvolatile semiconductor memory device according to claim 9, wherein the first select transistor comprises:

a second semiconductor layer extending in the perpendicular direction with respect to the semiconductor substrate and functioning as a body of the first select transistor;

a first gate insulating layer provided on a side surface of the second semiconductor layer; and a second conductive layer provided so as to sandwich the first gate insulating layer with the second semiconductor layer and functioning as a gate of the first select transistor, and the second select transistor comprises:

a third semiconductor layer extending in the perpendicular direction with respect to the semiconductor substrate and functioning as a body of the second select transistor;

a second gate insulating layer provided on a side surface of the third semiconductor layer; and a third conductive layer provided so as to sandwich the second gate insulating layer with the third semiconductor layer and functioning as a gate of the second select transistor.

11. The nonvolatile semiconductor memory device according to claim 1, wherein the control circuit executes a write verify operation to judge whether the threshold voltage of the memory cell is a first value or not by supplying a fourth voltage to the gate of the memory cell, the third voltage is larger than the fourth voltage, and smaller than a maximum value of the second voltage.

12. A method of data write in a nonvolatile semiconductor memory device, the nonvolatile semiconductor memory device comprising:

a semiconductor substrate; and a memory cell array including a plurality of memory cells stacked on the semiconductor substrate, each of the memory cells comprising:

a first semiconductor layer extending in a perpendicular direction with respect to the semiconductor substrate and functioning as a body of the memory cell;

a charge storage layer provided on a side surface of the first semiconductor layer; and a first conductive layer provided so as to sandwich the charge storage layer with the first semiconductor layer and functioning as a gate of the memory cell, the method of data write comprising:

executing a first program operation that supplies a first voltage to the body of the memory cell and supplies a second voltage larger than the first voltage to the gate of the memory cell, and then executing a second program operation that renders the body of the memory cell in a floating state and supplies a third voltage which is positive to the gate of the memory cell.

13. The method of data write in a nonvolatile semiconductor memory device according to claim 12, further comprising:

after executing the first program operation, executing a write verify operation to judge whether the threshold voltage of the memory cell is a first value or not, in the case that in the write verify operation the threshold voltage of the memory cell is judged to be the first value, executing the second program operation, and in the case that in the write verify operation the threshold voltage of the memory cell is judged not to be the first value, executing the first program operation again.

14. The method of data write in a nonvolatile semiconductor memory device according to claim 13, further comprising:

after executing the second program operation, executing the write verify operation.

15. The method of data write in a nonvolatile semiconductor memory device according to claim 12, further comprising:

after executing the first program operation and the second program operation, executing a write verify operation to judge whether the threshold voltage of the memory cell is a first value or not, and in the case that in the write verify operation the threshold voltage of the memory cell is judged not to be the first value, executing the first program operation again.

16. The method of data write in a nonvolatile semiconductor memory device according to claim 12, wherein a plurality of the memory cells are connected in series, and the method of data write further comprises:

during the second program operation, supplying the third voltage simultaneously to the gates of the plurality of the memory cells connected in series.

17. The method of data write in a nonvolatile semiconductor memory device according to claim 16, further comprising:

after executing the first program operation, executing a write verify operation to judge whether the threshold voltage of the memory cell is a first value or not, and in the case that in the write verify operation the threshold voltage of the plurality of the memory cells connected in series is judged to be the first value, executing the second program operation.

18. The method of data write in a nonvolatile semiconductor memory device according to claim 12, further comprising:

executing a read operation for reading data from the memory cells and an erase operation for erasing data retained in the memory cells, and executing the second program operation during a standby state except for a time of execution of the read operation and the erase operation.

19. The method of data write in a nonvolatile semiconductor memory device according to claim 12, further comprising:

after executing the first program operation, executing a write verify operation to judge whether the threshold voltage of the memory cell is a first value or not, and when executing the first program operation again after executing the write verify operation, stepping up the second voltage.

20. The method of data write in a nonvolatile semiconductor memory device according to claim 12, further comprising:

executing a write verify operation to judge whether the threshold voltage of the memory cell is a first value or not by supplying a fourth voltage to the gate of the memory cell, the third voltage is larger than the fourth voltage, and smaller than a maximum value of the second voltage.

* * * * *